United States Patent
Hoecht et al.

(10) Patent No.: US 11,774,533 B2
(45) Date of Patent: Oct. 3, 2023

(54) MAGNETIC RESONANCE TOMOGRAPHY WITH SIGNAL INTERFERENCE SUPPRESSION

(71) Applicant: Siemens Healthcare GmbH, Erlangen (DE)

(72) Inventors: Philipp Hoecht, Lauf (DE); Juergen Nistler, Erlangen (DE); Ludwig Eberler, Neumarkt (DE); Stephan Kannengiesser, Wuppertal (DE); Dieter Ritter, Fuerth (DE); Stephan Biber, Erlangen (DE); Rainer Schneider, Erlangen (DE); Jan Bollenbeck, Eggolsheim (DE)

(73) Assignee: SIEMENS HEALTHCARE GMBH, Erlangen (DE)

( * ) Notice: Subject to any disclaimer, the term of this patent is extended or adjusted under 35 U.S.C. 154(b) by 0 days.

(21) Appl. No.: 17/744,922

(22) Filed: May 16, 2022

(65) Prior Publication Data

US 2022/0373626 A1 Nov. 24, 2022

(30) Foreign Application Priority Data

May 19, 2021 (DE) ...................... 10 2021 205 090.5

(51) Int. Cl.
    *G01R 33/56* (2006.01)
    *G01R 33/48* (2006.01)
    *G01R 33/483* (2006.01)

(52) U.S. Cl.
    CPC ....... *G01R 33/481* (2013.01); *G01R 33/4812* (2013.01); *G01R 33/4814* (2013.01); *G01R 33/4833* (2013.01); *G01R 33/56* (2013.01)

(58) Field of Classification Search
    CPC ................ G01R 33/00; G01R 33/0035; G01R 33/0023; G01R 33/0017; G01R 31/3191;
    (Continued)

(56) References Cited

U.S. PATENT DOCUMENTS 8,258,788 B2 * 9/2012 Hulbert .............. G01R 33/3692
                                                        324/318
2008/0027308 A1   1/2008 Ladebeck
(Continued)

FOREIGN PATENT DOCUMENTS

DE    102006027417 A1    12/2007
DE    102008047217 A1    3/2010

OTHER PUBLICATIONS

Sherwood, Victoria et al: "Development of a hybrid magnetic resonance and ultrasound imaging system"; BioMed Research International, pp. 16, vol. 2014, Year: 2014.

*Primary Examiner* — Jermele M Hollington
*Assistant Examiner* — Taqi R Nasir
(74) *Attorney, Agent, or Firm* — Harness, Dickey & Pierce, P.L.C.

(57) ABSTRACT

An imaging apparatus has an MRT system with an MR receiving antenna configured to receive a first receive signal containing an MR signal from an object to be examined during an examination period. The imaging apparatus includes a modality for examining the object and/or for acting on the object via mechanical or electromagnetic waves, wherein the modality has an electronic circuit. The imaging apparatus includes an auxiliary antenna arranged and configured to receive a second receive signal containing an interference signal generated by the electronic circuit during the examination period. The imaging apparatus has a processing system configured to suppress interference in the first receive signal based on the first and the second receive signal.

24 Claims, 1 Drawing Sheet

(58) Field of Classification Search
CPC .......... G01R 33/0358; G01R 33/0356; G01R 33/481; G01R 33/56; G01R 33/4833; G01B 7/004; G01C 17/38; G06F 3/017; G06F 3/0346; G06F 3/012; H01L 39/223
See application file for complete search history.

(56) References Cited

U.S. PATENT DOCUMENTS

| | | |
|---|---|---|
| 2008/0312526 A1 | 12/2008 | Gagnon et al. |
| 2010/0074365 A1 | 3/2010 | Ladebeck et al. |
| 2017/0108569 A1* | 4/2017 | Harvey .................. G01R 33/36 |
| 2020/0249292 A1* | 8/2020 | Biber .................. G01R 33/3692 |
| 2021/0103018 A1 | 4/2021 | Biber et al. |

* cited by examiner

MAGNETIC RESONANCE TOMOGRAPHY WITH SIGNAL INTERFERENCE SUPPRESSION

CROSS-REFERENCE TO RELATED APPLICATION(S)

The present application claims priority under 35 U.S.C. § 119 to German Patent Application No. DE 10 2021 205 090.5, filed May 19, 2021, the entire contents of which are incorporated herein by reference.

FIELD

One or more embodiments of the present invention relate to an imaging apparatus with a magnetic resonance tomography system and a modality for examining an object or for acting on the object via mechanical or electromagnetic waves. One or more embodiments of the present invention further relate to a method for magnetic resonance tomography and a computer program product.

BACKGROUND

Systems for magnetic resonance tomography, MRT, are imaging apparatuses, which, to map an examination object, align nuclear spins of the examination object with a strong external magnetic field and excite them to precession about the corresponding alignment via an alternating magnetic field. The precession or return of the spins from this excited state into a lower energy state in turn generates a response in the form of an alternating magnetic field that can be detected via receiving antennas.

Magnetic gradient fields can be used to impart spatial encoding to the signals that subsequently enables the assignment of the received signal to a volume element of the examination object. The received signal can then be evaluated, for example to provide a three-dimensional imaging representation of the examination object. The receiving antennas used can, for example, be local receiving antennas, so-called local coils that, to achieve a better signal-noise ratio, SNR, can be arranged directly on the examination object. However, the receiving antennas can also be arranged in the vicinity of the examination object or, for example, installed in a patient couch.

MRT systems can be combined with other imaging modalities, such as, for example, systems for positron emission tomography, PET, or systems for acting on the examination object, for example via high-intensity focused ultrasound waves, HIFU, or elastography systems, to form hybrid systems. To avoid MRT image artifacts resulting from electromagnetic interference signals radiated by the electronics of the additional modality, for example internal clock signals, signals for data processing, etc., components of the modality, for example detectors, actuators, emitters etc., can be installed in a shielded housing, for example a copper-clad plastic housing.

However, this, on the one hand, has the disadvantage that eddy currents can be excited in the shielded housing due to the gradient activity of the MRT system. This results in heating-up of the shielded housing, and consequently also the internal, possibly temperature-sensitive electronics. This can impair accuracy or effectiveness of the additional modality. The eddy currents can also generate artifacts in the MRT imaging, for example so-called ghosting artifacts.

Therefore, in known hybrid systems, slots are provided in the shielded housing, for example. However, this cannot completely prevent eddy currents and their adverse effects.

US 2020/0249292 A1 describes an MRI scanner with active interference suppression and a corresponding method. In this case, a first receiving antenna is provided for receiving a magnetic resonance signal from a patient and a second receiving antenna for receiving an interference signal. A receiver connected to the receiving antennas is designed to suppress the interference signal received with the second receiving antenna in the magnetic resonance signal received by the first receiving antenna.

SUMMARY

One or more embodiments of the present invention, in the case of a hybrid system with an MRT system and a further modality, may further reduce the requirements for shielding components of the modality that may interfere with magnetic resonance tomography.

An embodiment of the present invention discloses an imaging apparatus with an examination area for placing an object to be examined. The imaging apparatus comprises a magnetic resonance tomography system, MRT system, with a magnetic resonance, MR, receiving antenna. The MR receiving antenna is arranged and configured to receive a first receive signal containing an MR signal from the object during an examination period. The imaging apparatus comprises a modality for examining the object via mechanical or electromagnetic waves and/or for acting on the object via the mechanical or electromagnetic waves. Herein, the modality includes an electronic circuit for operating the modality. The imaging apparatus has an auxiliary antenna arranged and configured to receive, during the examination period, a second receive signal containing an interference signal generated by the electronic circuit and emitted into the examination area. The imaging apparatus has a processing system configured to suppress interference in the first receive signal based on the first receive signal and the second receive signal, thus reducing the influence of the interference signal, in particular the influence of the interference signal on the interference-suppressed first receive signal, compared to the influence of the interference signal on the first receive signal.

The modality can, for example, be a further imaging modality in addition to the MRT system. In this case, the modality is embodied to examine the object via the mechanical or electromagnetic waves. One example of this is a system for positron emission tomography, PET. In this case, the modality is configured to examine the object via the electromagnetic waves, which in particular correspond to gamma radiation.

A further example of the modality is a system for high-intensity focused ultrasound application, HIFU. In this case, the modality is configured to act on the object via the mechanical waves, which, in this case, are ultrasound waves.

A further example of the modality would be an elastography system. In this case, the modality is configured to examine the object and to act on the object via the mechanical waves, which, in this case, are pressure waves generated by cyclic compression of the object.

However, other modalities for examining the object and/or acting on the object are also possible. In any case, the modality contains the electronic circuit for operating the modality. Herein, the electronic circuit can include an analog and/or a digital circuit, possibly an integrated circuit and/or a computing unit. Depending upon the embodiment of the modality, the electronic circuit can be used for different purposes in the operation of the modality.

In the case of modalities for examining the object via the mechanical or electromagnetic waves, the electronic circuit can, for example, contain a receiver or frontend for receiving corresponding signals attributable to the mechanical or electromagnetic waves. The electronic circuit can also be used to digitize and/or preprocess the correspondingly received signals. If the modality is a modality for acting on the object, the electronic circuit can, for example, be used to generate the mechanical or electromagnetic waves, for amplification and/or to emit the electromagnetic waves.

Therefore, in its intended operation, the electronic circuit generally generates time-variant magnetic fields and/or electromagnetic waves, which it can emit in the form of the interference signal inter alia in the direction of the examination area. This can, for example, be caused by internal clock signals in the electronic circuit, data processing operations in the electronic circuit, for example for the digitization of signals, etc.

As a result, the first receive signal is generally influenced by the interference signal, which can lead to artifacts in the image reconstruction. In other words, the MR receiving antenna preferably receives the MR signal, but the first receive signal also contains part of the interference signal. Conversely, the auxiliary antenna does not usually exclusively receive the interference signal, but may also receive a small component of the MR signal. The fact that the second receive signal contains the interference signal can therefore be understood to mean that the second receive signal corresponds to a superimposition of the interference signal with the MR signal or a part of the MR signal. The same applies to the first receive signal.

The processing system can contain one or more computing units and/or one or more analog or digital circuits, in particular for signal processing. In particular, the processing system can reconstruct an MRT image based on the interference-suppressed first receive signal.

A computing unit can in particular be understood to mean a data processing device, i.e. the computing unit can also in particular process data for performing computing operations. This may also include operations for performing indexed accesses to a data structure, for example a look-up table, LUT.

The computing unit can in particular contain a computer, a microcontroller or an integrated circuit, for example an application-specific integrated circuit, ASIC, a field-programmable gate array, FPGA, and/or a system on a chip, SoC. The computing unit can also contain a processor, for example a microprocessor, a central processing unit, CPU, a graphics processing unit, GPU, and/or a signal processor, in particular a digital signal processor, DSP. The computing unit can also include a physical or a virtual network of computers or some of the other units named. In this case, the computing unit can, for example, also be called a computing system.

In various exemplary embodiments, the computing unit includes one or more hardware and/or software interfaces and/or one or more memory units.

A memory unit can be embodied as a volatile data memory, for example a dynamic random access memory, DRAM, or static random access memory, SRAM, or as a non-volatile data memory, for example a read-only memory, ROM, as a programmable read-only memory, PROM, an erasable read-only memory, EPROM, as an electrically erasable read-only memory, EEPROM, as a flash memory or flash EEPROM, as a ferroelectric random access memory, FRAM, as a magnetoresistive random access memory, MRAM or as a phase-change random access memory, PCRAM.

The examination area can, for example, correspond to a patient tunnel or part of the patient tunnel, also called a bore.

In a simple case, the processing system for suppressing interference in the first receive signal can, for example, ignore the component of the MR signal in the second receive signal. In this case, the second receive signal approximately represents the interference signal. Therefore, the influence of the interference signal on the first receive signal can be reduced by subtracting the second receive signal, possibly weighted in magnitude and/or phase, from the first receive signal. However, more complex algorithms for interference suppression are also conceivable, for example algorithms for independent component analysis, ICA, or for principal component analysis, PCA. In particular, in addition to the auxiliary antenna further auxiliary antennas may be provided at different positions in order to detect further receive signals each of which generally include different parts of the interference signal and the MR signal. This can achieve a multivariant separation of the signals.

In particular, the processing system can in each case determine a generally complex weighting factor for the first receive signal and the second receive signal and possibly for the corresponding further receive signals received via the further auxiliary antennas and generate the interference-suppressed first receive signal by combining them appropriately, for example by forming a corresponding weighted sum. This can be achieved by analog and/or digital signal processing.

This enables the influence of the interference signal on the MRT image reconstruction to be reduced. Accordingly, the requirements for shielding the electronic circuit by a corresponding metal-containing shielding housing or the like can be reduced without having to accept a deterioration of the MRT image quality. Ideally, it is possible to completely dispense with such shielding of the electronic circuit. Therefore, embodiments of the present invention specifically allow the electronic circuit to influence the first receive signal by the interference signal and the influence of the interference signal on the first receive signal is subsequently at least partially compensated via the second receive signal.

Dispensing with shielded housing or reducing the use of metallic components in the housing can also reduce eddy currents. This is in particular advantageous in the case of a PET system as a modality since the accuracy of the PET measurement is not influenced due to heating-up of the temperature-sensitive detector electronics of the PET system. Furthermore, it is also possible to avoid or reduce artifacts, for example ghosting, in the MRT imaging.

Another advantage is that the structure and mode of operation of the modality and the electronic circuit are generally known when using the MRT system. Therefore, the electronic circuit in particular represents an internal and characterizable or quantifiable source of interference, which simplifies the combination of the first receive signal with the second receive signal and possibly the further receive signals of the further auxiliary antennas in order to compensate the influence of the interference signal as efficiently as possible.

The processing system can, for example, contain an interference-suppression facility configured to suppress interference in the first receive signal based on the first and the second receive signal. The interference-suppression facility can, for example, include a programmable logic unit, for example a field-programmable gate array, FPGA, or a digital signal processor, DSP. The interference suppression of the first receive signal can then take place in real time, for example.

However, it is also possible for the interference-suppression apparatus to comprise a memory that initially stores the first receive signal and the second receive signal. Then, the interference suppression of the first receive signal, for example, only takes place at a later point in time with a delay, for example, of the duration of an echo sequence, an excitation sequence or an entire image acquisition of a single slice or the entire image acquisition sequence of the MRT system. The delay can, for example, be more than 50 ms, more than 100 ms, more than 0.5 s, more than 1 s, more than 10 s, more than 1 min or even longer.

The processing system can have a receiver for receiving the first and the second receive signal. The receiver can, for example, be part of the interference-suppression facility or vice versa. Herein, the receiver can in particular include hardware for analog and/or digital high-frequency processing, such as, for example, one or more amplifiers, mixers or filters and/or an image evaluation unit for the later generation of the MRT spatial images or other images from the interference-suppressed first receive signal.

According to at least one embodiment of the imaging apparatus, the MRT system comprises a transmitting antenna configured to send at least one excitation pulse into the examination area during the examination period and the MR signal is received via the MR receiving antenna in response to the at least one excitation pulse. Herein, the excitation pulse in particular corresponds to an electromagnetic pulse, also called a radio-frequency pulse or RF pulse. The at least one excitation pulse in particular excites the nuclear spins of the object in the examination area to precession so that their resonance can lead to the MR signal.

It will be understood that a homogeneous basic magnetic field is also generated during the examination period, for example via a field magnet of the MRT system, as well as a sequence of magnetic field gradients, in particular via one or more gradient coils of the MRT system.

According to at least one embodiment, the modality has an ultrasound source and the electronic circuit is configured to actuate the ultrasound source to generate the mechanical waves as ultrasound waves.

The modality is in particular embodied as an HIFU system. Therefore, the modality is embodied to act on the object via the mechanical waves, in particular the object is not examined by the modality.

According to at least one embodiment, the modality has a mechanical actuator. The electronic circuit is configured to actuate the actuator to cyclically compress the object and in particular cyclically relieve the pressure.

Herein, the actuator can, for example, be brought into direct mechanical contact with the object. Therefore, the cyclic compression and pressure relief cause the mechanical waves to be generated as pressure waves in the object. In particular, therefore, the modality is embodied as an elastography system. Herein, the influence of the pressure waves on the MRT imaging can be evaluated. Therefore, there is in particular an effect on the object and an examination of the object takes place via the mechanical waves.

According to at least one embodiment, the modality is embodied as a PET system.

In particular, the modality comprises a detector configured to detect gamma radiation from the object and to generate a detector signal, in particular an analog detector signal, in dependence on the detected gamma radiation. The electronic circuit is connected to the detector in order to receive the detector signal and configured to process the detector signal.

In PET, the object is treated with a radioactive substance which emits positrons, i.e. beta radiation before the examination. If the object is a patient, in particular a radiopharmaceutical is administered, for example intravenously. The correspondingly emitted positrons interact with the electrons present in the object so that annihilation occurs as a result of which two high-energy photons, gamma radiation, are emitted in opposite directions. The gamma radiation emitted in this way can also be called annihilation radiation. The detector of the PET system is configured and arranged in a manner suitable for detecting the annihilation radiation.

In particular, the modality can have a plurality of detector pairs arranged in a ring around the examination area. Herein, two detectors of a detector pair are arranged on opposite sides of the examination area such that they can each detect gamma radiation with propagation directions that differ by 180 degrees. The electronic circuit can be connected to each detector of the plurality of detector pairs and process the corresponding detector signals. Alternatively or additionally, a plurality of corresponding electronic circuits can be provided, for example one electronic circuit for each detector pair or for each detector.

In particular, in addition to the auxiliary antenna, further auxiliary antennas can be provided for the detectors of the plurality of detector pairs, wherein for example, one of the auxiliary antennas can be spatially and/or functionally assigned to each of the detectors. This enables particularly exact compensation of the corresponding interference signals to be achieved.

The description of the features given here and below with regard to the detector can be transferred analogously to all further detectors of the modality and, where applicable, to all further electronic circuits.

The electronic circuit can, for example, include an analog receive frontend for receiving the detector signal and/or an amplifier and/or an analog-to-digital converter and/or one or more filters for processing the detector signal. In particular, the processing of the detector signal results in the interference signal or at least partially causes the interference signal. For example, sampling the detector signal to digitize the detector signal by the electronic circuit the interference signal can at least partially cause the interference signal.

According to at least one embodiment in which the modality is embodied as a PET system, the processing system is configured to generate a PET image in dependence on the detector signal, in particular the digitized detector signal.

According to at least one embodiment, the electronic circuit is connected to the auxiliary antenna in order to receive the second receive signal and the electronic circuit is configured to generate a digital second receive signal in dependence on the second receive signal.

Herein, the digitized second receive signal can occur via digitization of the second receive signal or a preprocessed version of the second receive signal.

According to at least one embodiment, the electronic circuit is configured to generate the digitized detector signal in dependence on the detector signal.

For this purpose, the electronic circuit can in particular digitize the detector signal directly or a preprocessed version of the detector signal.

In advantageous embodiments, the electronic circuit can both generate the digitized second receive signal in dependence on the second receive signal and the digitized detector signal in dependence on the detector signal. This has the advantage that the digitized detector signal and the digitized second receive signal can at least partially be transmitted together to the processing system so that the overall outlay for signal lines or cabling is reduced.

In particular, the modality comprises a common signal line and the electronic circuit is configured to transmit the digitized detector signal and the digitized second receive signal to the processing system signal via the common signal line. For example, the common signal line can include a fiber-optic line.

In embodiments in which the electronic circuit is configured to generate the digitized second receive signal, the processing system is in particular configured to suppress interference in the first receive signal in dependence on the digitized second receive signal.

According to at least one embodiment, the modality comprises a cable that in particular contains copper or another metal and is connected to the electronic circuit, and the auxiliary antenna is coupled, for example inductively coupled, to the cable in order to receive the second receive signal from the cable.

In other words, the auxiliary antenna is substantially arranged directly on the cable in order to receive the second receive signal. Such embodiments are in particular advantageous when the interference signal propagates in the cable. Herein, the cable can be used to supply power and/or to actuate the electronic circuit, for example via the processing system.

One advantage of such embodiments is that the cable may possibly remain more or less unchanged in the imaging apparatus even when defective detectors or detectors requiring maintenance are replaced. Accordingly, the replacement of the detector also has no influence on the coupling of the auxiliary antenna to the cable or has no influence on the position or orientation of the auxiliary antenna. This avoids the need to recalibrate the processing system on the replacement of detectors in order to suppress interference in the first receive signal.

According to at least one embodiment, the modality comprises a detector housing and the detector and the auxiliary antenna are arranged within the detector housing. For example, the electronic circuit is also arranged in the detector housing.

This enables particularly cost-effective integration of the auxiliary antenna and also particularly direct detection of the interference signal to be achieved. For example, the auxiliary antenna can be installed directly with or on the electronic circuit. For example, the auxiliary antenna can be arranged on a circuit substrate of the electronic circuit. This enables compact and cost-effective, yet very precise, detection of the interference signal.

According to at least one embodiment, the MRT system contains a gradient coil for generating a magnetic field gradient in the examination area. The MRT system also has a transmitting antenna for emitting the at least one excitation pulse into the examination area. The detector housing is arranged in a radial direction between the transmitting antenna and the gradient coil with respect to a longitudinal axis of the examination area.

The transmitting antenna can in particular be embodied as a body coil or include a body coil. The longitudinal axis of the examination area in particular corresponds to a longitudinal axis of the patient tunnel. The gradient coil and the transmitting antenna can encircle the examination area tangentially so that they in particular form approximately concentric cylinder jackets or lie on approximately concentric cylinder jackets. The detector housing can also encircle the longitudinal axis in a ring shape.

In order to shield the at least one excitation pulse from the outside, the imaging apparatus can comprise an RF shield arranged in a radial direction with regard to the longitudinal axis, for example between the transmitting antenna and the detector housing.

In addition to shielding the at least one excitation pulse by the RF shield, this also ensures that the interference signal couples significantly more strongly into the auxiliary antenna than the MR signal. This simplifies the separation of the MR signal from the interference signal and thereby the interference suppression of the first receive signal.

According to at least one embodiment, the processing system is configured to reconstruct a PET image in dependence on the detector signal and/or to reconstruct an MR image, in particular a spatial image, in dependence on the interference-suppressed first receive signal.

According to at least one embodiment, the processing system is configured to suppress interference in the second receive signal based on the first receive signal and the second receive signal, thus reducing the influence of the interference signal on the interference-suppressed second receive signal, in particular compared to the influence of the interference signal on the non-interference-suppressed second receive signal. The processing system can reconstruct the MR image in dependence on the interference-suppressed first receive signal and the interference-suppressed second receive signal.

In particular, it is also advantageously possible to use the component of the MR signal which is received via the auxiliary antenna as part of the second receive signal for the image reconstruction.

A further aspect of an embodiment of the present invention also discloses a method for magnetic resonance tomography. During an examination period, an MR receiving antenna receives a first receive signal containing an MR signal from an object to be examined placed in an examination area. An electronic circuit for operating a modality for examining the object via mechanical or electromagnetic waves and/or for acting on the object via the mechanical or electromagnetic waves generates an interference signal and emits it into the examination area. An auxiliary antenna receives a second receive signal containing the interference signal during the examination period. Interference is suppressed in the first receive signal based on the first receive signal and the second receive signal, in particular via a processing system, thus reducing the influence of the interference signal on the interference-suppressed first receive signal compared to the influence of the interference signal on the first receive signal.

According to at least one embodiment of the method, an MR image is generated based on the interference-suppressed first receive signal, in particular via the processing system.

According to at least one embodiment, a detector of the modality detects gamma radiation from the object and a detector signal is generated in dependence on the detected gamma radiation. The detector signal is processed via the electronic circuit.

Further embodiments of the method according to the present invention follow directly from the various embodiments of the imaging apparatus according to the present invention and vice versa. In particular, an imaging apparatus according to an embodiment of the present invention can be configured to perform the method according to an embodiment of the present invention or it performs such a method.

A further aspect of an embodiment of the present invention discloses a computer program product with instructions. When the instructions are executed by an imaging apparatus according to an embodiment of the present invention, in particular by a computing unit of the imaging apparatus, for example the processing system of the imaging apparatus, the instructions cause the imaging apparatus to perform a method according to an embodiment of the present invention.

A further aspect of an embodiment of the present invention discloses a computer-readable storage medium that stores a computer program according to an embodiment of the present invention.

The computer program according to an embodiment of the present invention and the computer-readable storage medium according to the present invention can also be understood as respective computer program products with the instructions.

Further features of embodiments of the present invention result from the claims, the figures and the description of the figures. The features and feature combinations mentioned above in the description and the features and feature combinations named below in the description of the figures and/or shown in the figures can be encompassed by the present invention not only in the respective combination disclosed, but also in other combinations. The present invention in particular also encompass embodiments and feature combinations of the present invention that do not have all the features of an originally formulated claim. Moreover, the present invention encompasses embodiments and feature combinations that go beyond or deviate from the feature combinations set forth in the back-references of the claims.

BRIEF DESCRIPTION OF THE DRAWINGS

The present invention is described below in more detail with reference to specific example embodiments and associated schematic drawings. In the figures, identical or functionally identical elements can be given the same reference characters. The description of identical or functionally identical elements may not necessarily be repeated with respect to different figures.

In the figures.

DETAILED DESCRIPTION

Figure 1:
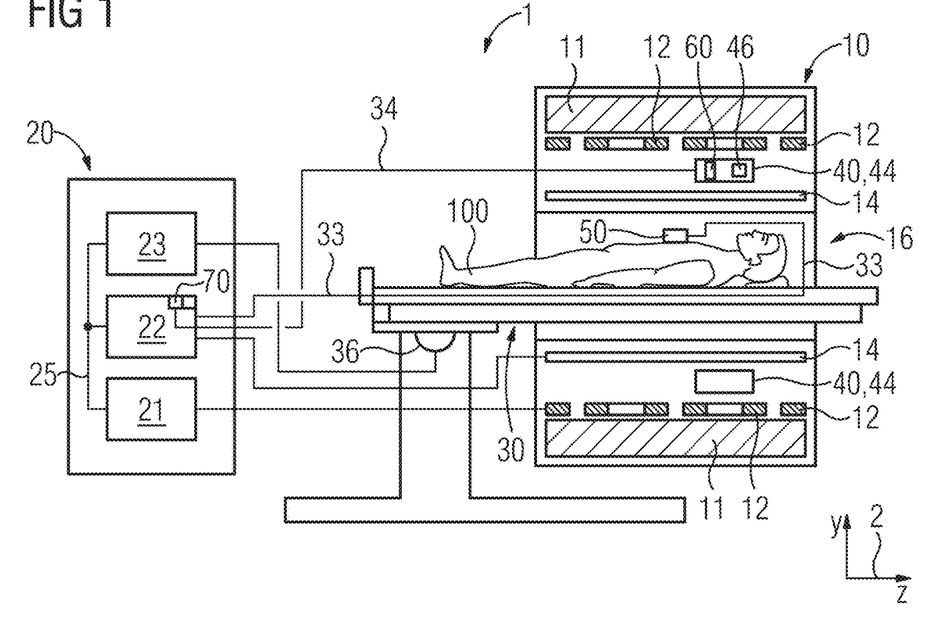
FIG. 1 shows a schematic representation of an example embodiment of an imaging apparatus according to the present invention and FIG. 2 shows a schematic cross-sectional view through a further example embodiment of an imaging apparatus according to the present invention.

FIG. 1 shows a schematic representation of an exemplary embodiment of an imaging apparatus 1 according to the present invention.

The imaging apparatus 1 has an MRT system 10 with a magnet unit containing a field magnet 11 that generates a static magnetic field for aligning nuclear spins of an object to be examined, for example a patient 100, in an examination area or recording area.

The recording area is in particular characterized by an extremely homogeneous static magnetic field, wherein the homogeneity in particular relates to the magnetic field strength or its magnitude. The recording area is, for example, almost spherical and positioned in a patient tunnel 16 that extends in a longitudinal direction 2 through the magnet unit. The field magnet 11 can, for example, be a superconducting magnet that can provide magnetic fields with a magnetic flux density of up to 3 T or more. However, for lower field strengths it is also possible to use permanent magnets or electromagnets with normally conducting coils. A patient couch 30 can be movable in the patient tunnel 16 by a traversing unit 36.

The magnet unit furthermore has gradient coils 12 designed to superimpose location-dependent magnetic fields on the magnetic field in the three spatial directions for spatial differentiation of the detected imaging areas in the recording area. The gradient coils 12 can, for example, be embodied as coils made of normally conducting wires that are, for example, able to generate mutually orthogonal fields or field gradients in the recording area.

The magnet unit can, for example, have a body coil 14 as a transmitting antenna which is designed to generate a corresponding alternating magnetic field in the examination area via a radio-frequency signal supplied via a signal line. In some embodiments, the body coil 14 can also be used to receive MR signals emitted by the patient 100 and deliver them via a signal line.

The imaging apparatus 1 has a control unit 20 that can supply the magnet unit with different signals for the gradient coils 12 and the body coil 14 and can evaluate the received signals. The control unit 20 can, for example, have a gradient controller 21 designed to supply, via supply lines, the gradient coils 12 with variable currents that can provide the desired gradient fields in the examination area in a time-coordinated manner.

The control unit 20 can also have a radio-frequency unit 22 designed to generate radio-frequency pulses or excitation pulses with predetermined time courses, amplitudes and spectral power distribution for exciting magnetic resonance of the nuclear spins in the patient 100. Herein, pulse powers in the kilowatt range can be used. The excitation pulses can be coupled into the patient 100 via the body coil 14 or via one or more local transmitting antennas. The control unit 20 can also contain a controller 23 that is able to communicate with the gradient controller 21 and the radio-frequency unit 22 via a signal bus 25.

Optionally, a local coil 50, which can be connected to the radio-frequency unit 22 via a connecting line 33, can be arranged in the immediate vicinity of the patient 100, for example on the patient 100 or in the patient couch 30. Depending on the embodiment, alternatively or additionally to the body coil 14, the local coil 50 can be used as an MR receiving antenna.

The imaging apparatus 1 also has a PET system, i.e. a system for positron emission tomography. The PET system contains a detector housing 44 surrounding the patient tunnel 16 in a ring shape and in particular arranged between the body coil 14 and the gradient coils 12. A plurality of radially opposite PET detectors 40 are arranged in the detector housing 44. In addition, an electronic circuit 46 is also arranged in the detector housing 44.

The PET detectors 40 can detect gamma radiation generated from the patient as a result of positron electron annihilation and generate corresponding analog detector signals based thereon. The detector signals can be preprocessed by the electronic circuit 46, for example amplified and/or digitized, and, for example, transmitted to the control unit 20 via a fiber-optic line 34. A processing system 70 of the control unit 20 can generate a PET image based on the preprocessed detector signals.

As part of the preprocessing of the analog detector signals, in particular by digitization of the detector signals, by the electronic circuit 46, the latter generates an electromagnetic interference signal and emits it, for example, into the examination area. The interference signal can then superimpose the MR signal received by the MR receiving antenna, in particular the local coil 50. Therefore, the MR receiving antenna receives a first receive signal, which contains the MR signal and is interfered with or influenced by the interference signal.

The imaging apparatus 1 furthermore contains an auxiliary antenna 60 arranged in such a way that it can receive a second receive signal containing the interference signal.

The first receive signal and the second receive signal can then be transmitted to the processing system 70, which can suppress interference in the first receive signal taking into account the second receive signal. For this purpose, the processing system 70 can in particular weight and superimpose the first and the second receive signal in a suitable manner in order to reduce the influence of the interference signal on the resulting interference-suppressed first receive signal.

Since the type, strength, frequency etc. of the interference signal are known, or can be determined via a calibration routine, and the position of the electronic circuit 46 is also known, the corresponding weighting factors can be determined in advance in the context of calibration and stored in the processing system 70. The concept can be extended accordingly to further auxiliary antennas.

The processing system 70 can, for example, comprise a summation facility, which can weight the incoming signals from the body coil 14 and/or the local coil 50 and from the auxiliary antenna 60 with the weighting factors, wherein the parameters can also be complex in order to represent a phase shift. This can, for example, take place in an analogous manner by an adjustable amplifier in conjunction with an adjustable phase shifter. A real part of a parameter then corresponds to a gain factor and an imaginary part of the parameter corresponds to the phase shift. After weighting, the signals are added together accordingly. However, also conceivable are other, in particular non-linear, signal operations for combining the individual signals or digital signal processing.

In the example in FIG. 1, the auxiliary antenna 60 is arranged in the detector housing 44, which enables a particularly cost-effective solution, for example by integrating the auxiliary antenna 60 on a circuit substrate of the electronic circuit 46. Alternatively, however, other positions of the auxiliary antenna 60 are possible, for example on a supply cable (not shown) of the electronic circuit 46 or at another location in the patient tunnel 16 or at an opening of the patient tunnel 16.

Figure 2:
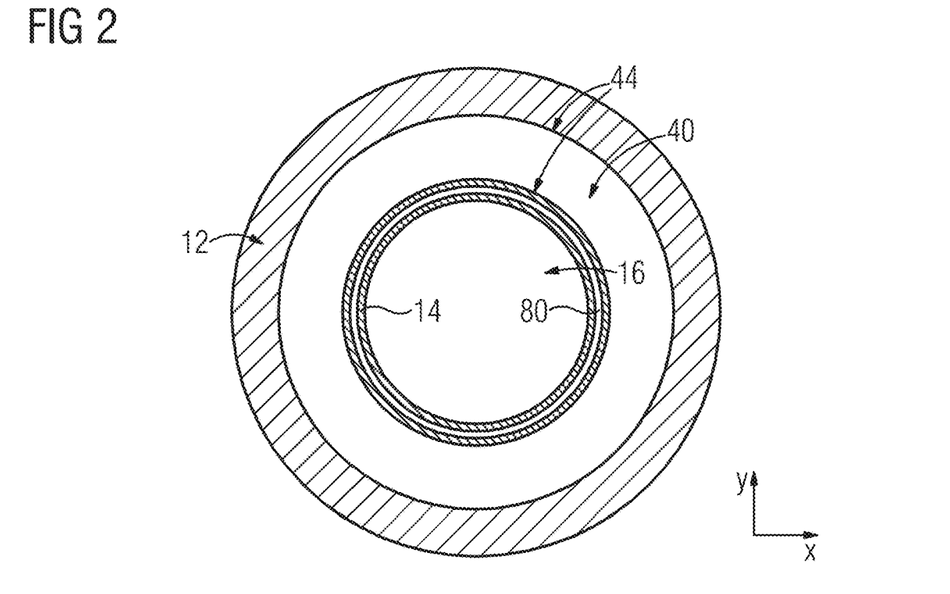

FIG. 2 is a schematic cross-sectional view through the patient tunnel 16 of an imaging apparatus 1 according to an embodiment of the present invention, for example, the one shown in FIG. 1.

In this embodiment, the imaging apparatus 1 has, for example, an RF shield 80 arranged between the body coil 14 and the detector housing 44.

As described above, in particular with respect to the figures, an embodiment of the present invention enables the requirements for shielding electronic components in an MRT hybrid system, in particular an MRT PET hybrid system, to be reduced. As a result, heating-up of a corresponding shielding housing and the associated negative effects on the electronics of the PET system and eddy-current-induced MRT image artifacts can be minimized.

Herein, it is in particular advantageous that the interference source in the form of the electronic circuit is stationary. For example, the auxiliary antenna can in particular measure significantly higher components of the interference signal than components of the MR signal. This can, for example, be achieved by installing the auxiliary antenna within the detector housing, for example directly on a circuit substrate of the electronic circuit.

In the case of a hybrid MRT PET system, it is, for example, possible for each detector of the PET system to be equipped with its own auxiliary antenna and the independent signals can be subtracted independently from the useful signal of the MR receiving antenna. If the individual interference signals are sufficiently similar, they can also be detected with a common antenna or with a low number of auxiliary antennas and combined to form a common signal and/or interference signal components that are not received by any of the auxiliary antennas can be taken into account via suitable weighting.

Prior knowledge of the type and time characteristics of the interference signals, for example the actual PET receive signal, can be used to reduce the number of auxiliary antennas required or to improve the quality of the interference suppression.

Since the arrangement of the interference sources with respect to the MR receiving antennas and with respect to the auxiliary antenna does not change over time, the weighting factors for compensating the interference signals can be determined very precisely before the actual MRT measurement. It is also possible to specify them or preset them by factory calibration or prediction on the basis of design parameters of the system.

If the interference propagates sufficiently on cables leading to the detectors, in corresponding embodiments, the interference signal can be picked up by the auxiliary antenna electromagnetically coupled to the metallic cable leading to the detector.

Furthermore, the design of the PET detectors, their electronics and further details of the design of the overall system can be optimized for interference suppression.

In advantageous embodiments, the signals of the auxiliary antennas are digitized in the same way in the corresponding detector, as are the PET detector signals, and transferred out of the bore via the same signal line, for example a fiber optic connection. Alternatively, they can also be routed to the outside via a copper connection.

However, it is not necessary to implement individual auxiliary antennas for different detectors in each case. For reasons of cost and complexity, a corresponding reduction in the total number of auxiliary antennas can be useful.

The residues or components of the MR signal contained in the receive signals of the auxiliary antennas can be discarded during further processing. However, the corresponding residual MR signal components can also be used for image reduction. Accordingly, all available signals containing components of the MR signal can be considered together in the sense of a subspace analysis and suitably separated.

In corresponding embodiments, the present invention can reduce heating-up of the temperature-sensitive PET detectors and eddy-current-induced image artifacts can also be reduced. It may be possible to completely dispense with shielding via a corresponding shielding housing so that the distances between crystals in the PET detectors can be minimized and thus the image quality of the PET image can be increased.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of the embodiments. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "on," "connected," "engaged," "interfaced," and "coupled." Unless explicitly described as being "direct," when a relationship between first and second elements is described in the disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" on, connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of the embodiments. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

It is noted that some embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed above. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing embodiments. The present invention may, however, be embodied in many alternate forms and should not be construed as limited to only the embodiments set forth herein.

In addition, or alternative, to that discussed above, units and/or devices according to one or more embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more embodiments, computer processing devices may be described as including various functional units that perform various operations and/or functions to increase the clarity of the description. However, computer processing devices are not intended to be limited to these functional units. For example, in one or more embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the embodiments, or they may be known devices that are altered and/or modified for the purposes of the embodiments.

A hardware device, such as a computer processing device, may run an operating system (OS) and one or more software applications that run on the OS. The computer processing device also may access, store, manipulate, process, and create data in response to execution of the software. For simplicity, one or more embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one example embodiment relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Although the present invention has been shown and described with respect to certain embodiments, equivalents and modifications will occur to others skilled in the art upon the reading and understanding of the specification. The present invention includes all such equivalents and modifications and is limited only by the scope of the appended claims.

What is claimed is:

1. An imaging apparatus with an examination area for placing an object to be examined, the imaging apparatus comprising:
   a magnetic resonance (MR) tomography system with an MR receiving antenna arranged and configured to receive a first receive signal containing an MR signal from the object during an examination period;
   a modality configured to at least one of (i) examine the object via mechanical or electromagnetic waves or (ii) act on the object via the mechanical or electromagnetic waves, wherein the modality has an electronic circuit to operate the modality;
   an auxiliary antenna configured to receive, during the examination period, a second receive signal containing an interference signal generated by the electronic circuit and emitted into the examination area; and
   a processing system configured to suppress interference in the first receive signal based on the first receive signal and the second receive signal, to reduce an influence of the interference signal.

2. The imaging apparatus as claimed in claim 1, wherein the modality includes an ultrasound source, and wherein the electronic circuit is configured to actuate the ultrasound source to generate the mechanical waves as ultrasound waves.

3. The imaging apparatus as claimed in claim 1, wherein the modality includes a mechanical actuator, and wherein the electronic circuit is configured to actuate the mechanical actuator to cyclically compress the object.

4. The imaging apparatus as claimed in claim 1, wherein the modality includes a detector configured to
   detect gamma radiation from the object, and
   generate a detector signal based on the gamma radiation;
   the electronic circuit is connected to the detector to receive the detector signal; and
   the electronic circuit is configured to process the detector signal.

5. The imaging apparatus as claimed in claim 4, wherein the electronic circuit is connected to the auxiliary antenna to receive the second receive signal; and
   the electronic circuit is configured to generate a digitized second receive signal based on the second receive signal.

6. The imaging apparatus as claimed in claim 5, wherein the electronic circuit is configured to generate a digitized detector signal based on the detector signal;
   the modality has a common signal line; and
   the electronic circuit is configured to transmit the digitized detector signal and the digitized second receive signal to the processing system via the common signal line.

7. The imaging apparatus as claimed in claim 4, wherein the modality includes a cable connected to the electronic circuit; and
   the auxiliary antenna is coupled to the cable to receive the second receive signal from the cable.

8. The imaging apparatus as claimed in claim 4, wherein the modality includes a detector housing; and
   the detector and the auxiliary antenna are arranged within the detector housing.

9. The imaging apparatus as claimed in claim 8, wherein the magnetic resonance tomography system has a gradient coil to generate a magnetic field gradient in the examination area;
   the magnetic resonance tomography system includes a transmitting antenna to emit at least one excitation pulse into the examination area; and
   the detector housing is arranged in a radial direction between the transmitting antenna and the gradient coil with respect to a longitudinal axis of the examination area.

10. The imaging apparatus as claimed in claim 4, wherein the processing system is configured to reconstruct a positron emission tomography image based on the detector signal.

11. The imaging apparatus as claimed in claim 1, wherein the processing system is configured to reconstruct a magnetic resonance image based on the interference-suppressed first receive signal.

12. The imaging apparatus as claimed in claim 11, wherein the processing system is configured to
    suppress interference in the second receive signal based on the first receive signal and the second receive signal, to reduce the influence of the interference signal on the second receive signal; and
    reconstruct the magnetic resonance image based on the interference-suppressed second receive signal.

13. The imaging apparatus as claimed in claim 5, wherein the modality includes a cable connected to the electronic circuit; and
    the auxiliary antenna is coupled to the cable to receive the second receive signal from the cable.

14. The imaging apparatus as claimed in claim 6, wherein the modality includes a cable connected to the electronic circuit; and
    the auxiliary antenna is coupled to the cable to receive the second receive signal from the cable.

15. The imaging apparatus as claimed in claim 5, wherein the modality includes a detector housing; and
    the detector and the auxiliary antenna are arranged within the detector housing.

16. The imaging apparatus as claimed in claim 6, wherein the modality includes a detector housing; and
    the detector and the auxiliary antenna are arranged within the detector housing.

17. The imaging apparatus as claimed in claim 5, wherein the processing system is configured to reconstruct a positron emission tomography image based on the detector signal.

18. The imaging apparatus as claimed in claim 6, wherein the processing system is configured to reconstruct a positron emission tomography image based on the detector signal.

19. The imaging apparatus as claimed in claim 2, wherein the processing system is configured to reconstruct a magnetic resonance image based on the interference-suppressed first receive signal.

20. The imaging apparatus as claimed in claim 5, wherein the processing system is configured to reconstruct a magnetic resonance image based on the interference-suppressed first receive signal.

21. The imaging apparatus as claimed in claim 6, wherein the processing system is configured to reconstruct a magnetic resonance image based on the interference-suppressed first receive signal.

22. A method for magnetic resonance (MR) tomography, the method comprising:
   receiving, at an MR receiving antenna during an examination period, a first receive signal containing an MR signal from an object to be examined that is placed in an examination area;
   generating and emitting, by an electronic circuit, an interference signal, wherein the electronic circuit operates a modality to at least one of (i) examine the object via mechanical or electromagnetic waves, or (ii) act on the object via the mechanical or electromagnetic waves, the interference signal being emitted into the examination area;
   receiving, at an auxiliary antenna, a second receive signal containing the interference signal during the examination period; and
   suppressing interference in the first receive signal based on the first receive signal and the second receive signal, to reduce an influence of the interference signal.

23. The method as claimed in claim 22, further comprising:
   detecting, via a detector of the modality, gamma radiation from the object;
   generating a detector signal based on the gamma radiation; and
   processing the detector signal via the electronic circuit.

24. A non-transitory computer readable storage medium storing computer-executable instructions which, when executed by an imaging apparatus, cause the imaging apparatus to perform the method as claimed in claim 22.

* * * * *